(12) United States Patent
Pi et al.

(10) Patent No.: US 9,035,688 B2
(45) Date of Patent: May 19, 2015

(54) SINGLE INPUT LEVEL SHIFTER

(71) Applicants: Konkuk University Industrial Cooperation Corp., Seoul (KR); Electronics and Telecommunications Research Institute, Daejeon (KR)

(72) Inventors: Jae-Eun Pi, Gyeonggi-do (KR); Kee-Chan Park, Gyeonggi-do (KR); Sangyeon Kim, Seoul (KR); Joondong Kim, Gyeonggi-do (KR); Yeon Kyung Kim, Daejeon (KR); HongKyun Lym, Seoul (KR); Sang-Hee Park, Daejeon (KR); Byoung Gon Yu, Chungcheongbuk-do (KR); Chi-Sun Hwang, Daejeon (KR); Jong Woo Kim, Seoul (KR); OhSang Kwon, Daejeon (KR); Min Ki Ryu, Daejeon (KR)

(73) Assignees: ELECTRONICS AND TELECOMMUNICATIONS RESEARCH INSTITUTE, Daejeon (KR); KONKUK UNIVERSITY INDUSTRIAL COOPERATION CORP., Seoul (KR)

( * ) Notice: Subject to any disclaimer, the term of this patent is extended or adjusted under 35 U.S.C. 154(b) by 0 days.

(21) Appl. No.: 14/010,579

(22) Filed: Aug. 27, 2013

(65) Prior Publication Data

US 2014/0062572 A1 Mar. 6, 2014

(30) Foreign Application Priority Data

Aug. 28, 2012 (KR) .......... 10-2012-0094439
Jan. 28, 2013 (KR) .......... 10-2013-0009285

(51) Int. Cl.
*H03L 5/00* (2006.01)
*H03K 17/30* (2006.01)
*H03K 19/0185* (2006.01)

(52) U.S. Cl.
CPC .......... *H03K 17/302* (2013.01); *H03K 19/0185* (2013.01)

(58) Field of Classification Search
CPC . H03K 17/302; H03K 17/145; H03K 17/162; H03K 3/36; H03K 3/356; H03K 3/012
USPC .......................................... 327/333
See application file for complete search history.

(56) References Cited

U.S. PATENT DOCUMENTS 5,949,398 A * 9/1999 Kim .............................. 345/100

FOREIGN PATENT DOCUMENTS

KR 10-0956748 B1 5/2010

OTHER PUBLICATIONS

Binn Kim, et al., "A Novel Level Shifter Employing IGZO TFT", IEEE EDL, vol. 32, No. 2, pp. 167-169, Feb. 2011.

*Primary Examiner* — John Poos
(74) *Attorney, Agent, or Firm* — Rabin & Berdo, P.C.

(57) ABSTRACT

Provided is a single input level shifter. The single input level shifter includes: an input unit applying a power voltage to a first node in response to an input signal and applying the input signal to a second node in response to a reference signal; a bootstrapping unit applying the power voltage to the second node according to a voltage level of the first node; and an output unit applying the input signal to an output terminal in response to the reference signal and applying the power voltage to the output terminal according to the voltage level of the first node, wherein the bootstrapping unit includes a capacitor between the first and second nodes, and when the input signal is shifted from a first voltage level to a second voltage level, the bootstrapping unit raises the voltage level of the first node to a level higher than the power voltage.

5 Claims, 4 Drawing Sheets

SINGLE INPUT LEVEL SHIFTER

CROSS-REFERENCE TO RELATED APPLICATIONS

This U.S. non-provisional patent application claims priority under 35 U.S.C. §119 of Korean Patent Application Nos. 10-2013-0009285, filed on Jan. 28, 2013, and 10-2012-0094439, filed on Aug. 28, 2012, the entire contents of which are hereby incorporated by reference.

BACKGROUND OF THE INVENTION

The present invention disclosed herein relates to a single input level shifter, and more particularly, to a single input level shifter having a single input signal and using bootstrap effect.

Recently, as a personal computer, a television, and so on become smaller, lighter, and thinner, a small, light, and thin display device is required. In order to satisfy such demands, a portable flat panel type display device using a liquid crystal display (LCD) or an organic light emitting diode (OLED) instead of a cathode ray tube (CRT) is under development. The flat panel type display device includes a thin film transistor (TFT) serving as a switching device.

In general, a voltage used for a semiconductor integrated circuit is a low voltage of less than about 5 V. However, a display device or a specific circuit uses a high voltage of more than 5 V. For example, a liquid crystal display device using a TFT may require a high voltage of about 20 V, as a pulse voltage supplied to a gate line. Accordingly, such a display device does not operate with a low voltage of less than about 5 V used for a typical semiconductor integrated circuit. Accordingly, a low voltage of less than about 5 V needs to be converted into a high voltage proper for a display device or a driving circuit for driving the same.

In order to shift low voltage into a level of high voltage proper for operations of a display device and a driving circuit, a level shifter is used. The level shifter mainly includes a single crystalline silicon wafer, an amorphous-silicon TFT, or an oxide TFT. However, when a TFT used for the level shifter has a complementary metal-oxide-semiconductor (CMOS) structure, manufacturing processes of the level shifter become complex and its manufacturing costs become high. Additionally, an oxide TFT has characteristics of a depletion mode in which threshold voltage (hereinafter, referred to be as VT) has a zero or negative value.

SUMMARY OF THE INVENTION

The present invention provides a single input level shifter formed through simple manufacturing processes and operating normally in a depletion mode.

Embodiments of the present invention provide single input level shifters including: an input unit applying a power voltage to a first node in response to an input signal and applying the input signal to a second node in response to a reference signal; a bootstrapping unit applying the power voltage to the second node according to a voltage level of the first node; and an output unit applying the input signal to an output terminal in response to the reference signal and applying the power voltage to the output terminal according to the voltage level of the first node, wherein the bootstrapping unit includes a capacitor between the first and second nodes, and when the input signal is shifted from a first voltage level to a second voltage level, the bootstrapping unit raises the voltage level of the first node to a level higher than the power voltage.

In some embodiments, the first voltage level may be less than the second voltage level, and the second voltage level may be greater than the reference signal and less than the power voltage.

In other embodiments, as the input signal is shifted from the second voltage level to the first voltage level, the output unit may discharge a voltage of the output terminal.

In other embodiments of the present invention, single input level shifters include: a first NMOS transistor connected between a first node and a power terminal and controlled in response to an input signal applied from an input terminal; a second NMOS transistor connected between the first NMOS transistor and the input terminal and controlled in response to a reference signal applied from a reference terminal; a third NMOS transistor connected between the power terminal and a second node and controlled in response to a voltage applied to the first node; a fourth NMOS transistor connected between the second node and the input terminal and controlled in response to the reference signal; a fifth NMOS transistor connected between the power terminal and an output terminal and supplying a power voltage to the output terminal according to a voltage applied to the first node; a sixth NMOS transistor connected between the output terminal and the input terminal and supplying the input signal to the output terminal in response to the reference signal; and a capacitor connected between the first and second nodes.

In some embodiments, the input signal may be shifted between a first voltage level and a second voltage level.

In other embodiments, the first voltage level may be less than the second voltage level, and the second voltage level may be greater than the reference signal and less than the power voltage.

In still other embodiments, the first to sixth NMOS transistors may be oxide thin film transistors.

In even other embodiments, the fourth NMOS transistor may be formed larger than the first, second, third, fifth, and sixth NMOS transistors.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
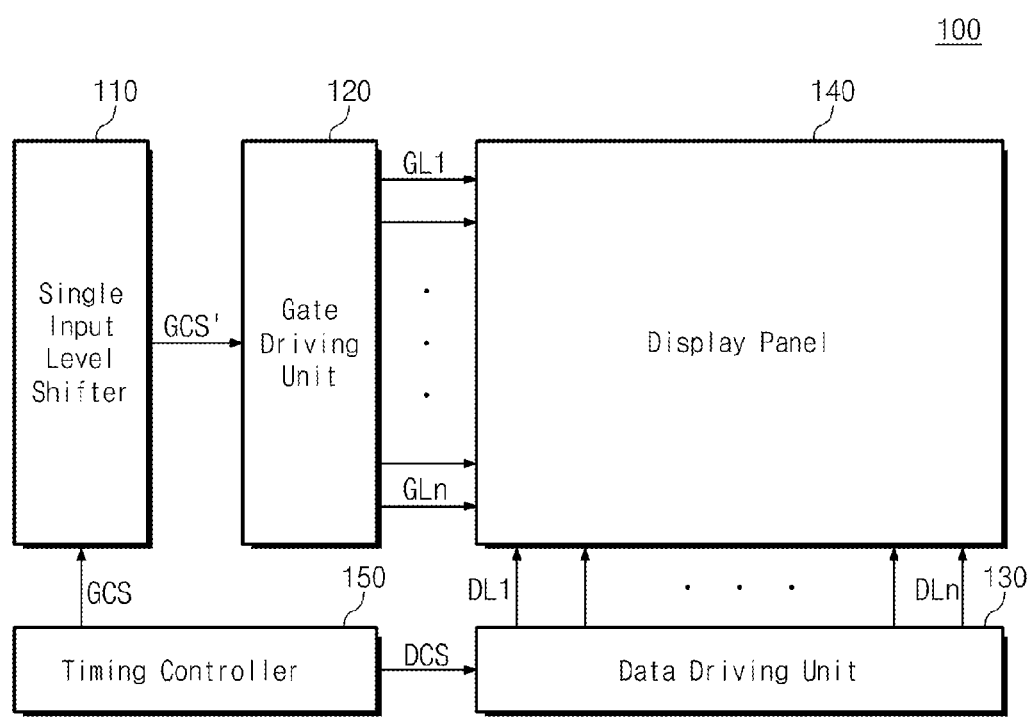
FIG. 1 is a block diagram of a display device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

FIG. 1 is a block diagram of a display device according to an embodiment of the present invention. Referring to FIG. 1, the display device 100 includes a single input level shifter 110, a gate driving unit 120, a data driving unit 130, a display panel 140, and a timing controller 150.

The single input level shifter 110 is electrically connected to the gate driving unit 120. The single input level shifter 110 receives a first control signal GCS generated from the timing controller 150. The single input level shifter 110 converts the received first control signal GCS into a voltage level necessary for the driving of the gate driving unit 120. The single input level shifter 110 applies the voltage level converted first control signal GCS' to the gate driving unit 120. Additionally, the single input level shifter 110 includes a plurality of TFTs and capacitors, and operates based on a single input signal. Accordingly, the single input level shifter 110 is formed through simple manufacturing processes at a reduced manufacturing cost. The structure and operation of the ingle input level shifter 110 will be described in more detail with reference to FIG. 2.

The gate driving unit 120 is electrically connected to the display panel 140 through a plurality of gate lines GL1 to GLn. The gate driving unit 120 applies a gate voltage to the plurality of gate lines GL1 to GLn in response to the first control signal GCS'.

The data driving unit 130 is electrically connected to the display panel 140 through a plurality of gate lines DL1 to DLn. The data driving unit 120 applies a data voltage to the plurality of data lines DL1 to DLn in response to a second control signal DCS generated from the timing controller 150.

The display panel 140 is electrically connected to the gate driving unit 120 through the plurality of gate lines GL1 to GLn. Additionally, the display panel 140 is electrically connected to the data driving unit 120 through the plurality of data lines DL1 to DLn. The display panel 140 is connected to the plurality of gate lines GL1 and GLn and the plurality of data lines DL1 and DLn, and includes a plurality of pixels arranged in a matrix. Each pixel operates according to a data voltage delivered through the data driving unit 130 and a gate voltage delivered through the gate driving unit 120.

The timing controller 150 controls overall operations of the display device 100. In more detail, the timing controller 150 generates the first control signal GCS and delivers it to the single input level shift 110. The timing controller 150 generates the second control signal DCS and delivers it to the data driving unit 130.

Figure 2:
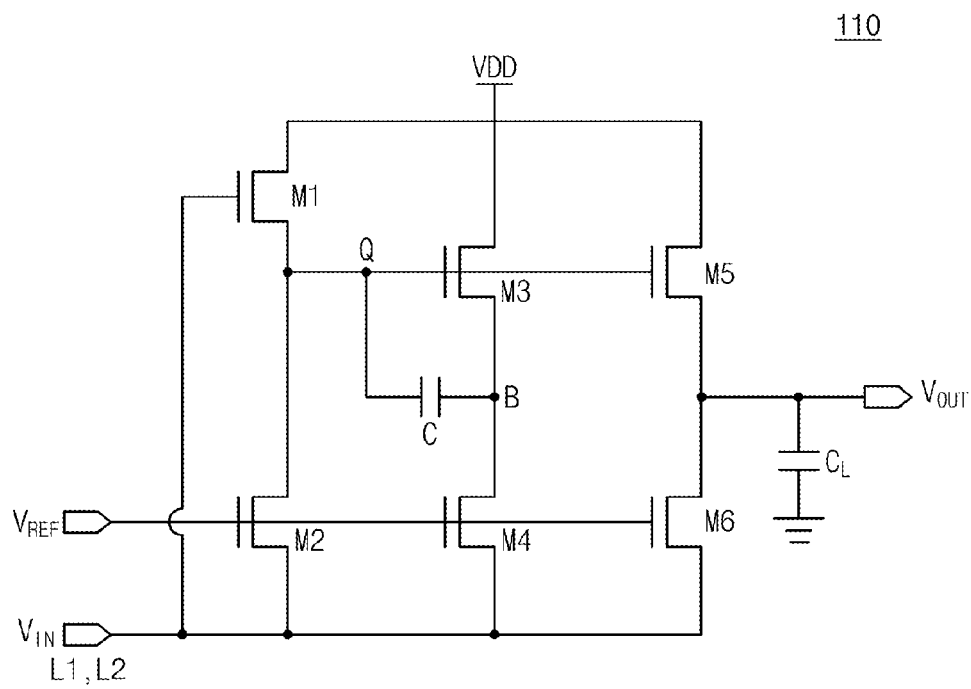
FIG. 2 is a circuit diagram of a single input level shifter according to an embodiment of the present invention.

FIG. 2 is a circuit diagram of a single input level shifter according to an embodiment of the present invention. Referring to FIG. 2, the single input level shifter 110 includes first to sixth NMOS TFTs M1, M2, M3, M4, M5, and M6, and a first capacitor C. Additionally a load capacitor CL may be provided to an output terminal. The first to sixth NMOS TFTs M1 to M6 may be oxide TFTs. However, the first to sixth NMOS TFTs M1 to M6 are not limited to oxide TFTs. In this present invention, the case that the first to sixth NMOS TFTs M1 to M6 are oxide TFTs will be described.

The oxide TFTs have a depletion characteristic in which a threshold voltage is 0 V or a negative voltage. Due to a depletion characteristic, an operation of a driving circuit including oxide TFTs may become unstable. The single input level shifter 110 according to an embodiment of the present invention prevents a driving circuit from being unstable in a depletion mode by using an input signal VIN changed in response to the first control signal GCS of FIG. 1.

The gate terminal of the first TFT M1 is connected to an input terminal. The gate terminal of the first TFT M1 receives an input signal VIN in response to the first control signal GCS, from an input terminal. The source terminal of the first TFT M1 is connected to a first node Q, and its drain terminal is connected to a power terminal. The first TFT M1 delivers a power voltage VDD to the first node Q in response to the input signal VIN applied to the gate terminal.

The gate terminal of the second TFT M2 is connected to a reference terminal to receive a reference signal VREF. The source terminal of the second TFT M2 is connected to the first node Q, and its drain terminal is connected to an input terminal. The drain terminal of the second TFT M2 receives the input signal VIN in response to the first control signal GCS, from an input terminal. The second TFT M2 delivers the input signal VIN to the first node Q in response to the reference signal VREF applied to the gate terminal.

The gate terminal of the third TFT M3 is connected to the first node Q, and receives a voltage of the first node Q. The drain terminal of the third TFT M3 is connected to the power terminal, and its source terminal is connected to a second node B. The first capacitor C is provided between the first node Q and the second node B. The first capacitor C is used to implement bootstrapping. The third TFT M3 delivers the power voltage VDD to the second node B according to a voltage of the first node Q.

The gate terminal of the fourth TFT M4 is connected to the reference terminal to receive the reference signal VREF. The drain terminal of the fourth TFT M4 is connected to the input terminal, and its source terminal is connected to the second node B. The drain terminal of the fourth TFT M4 receives the input signal VIN from the input terminal. The fourth TFT M4 delivers the input signal VIN to the second node B in response to the reference signal VREF applied to the gate terminal.

The gate terminal of the fifth TFT M5 is connected to the first node Q, and receives a driving voltage generated in the first node Q. The drain terminal of the fifth TFT M5 is connected to the power terminal, and its source terminal is connected to the output terminal. The fifth TFT M5 delivers the power voltage VDD to the output terminal according to a voltage of the first node Q.

The gate terminal of the sixth TFT M6 is connected to the reference terminal to receive the reference signal VREF. The drain terminal of the sixth TFT M6 is connected to the input terminal, and its source terminal is connected to the second node B. The drain terminal of the sixth TFT M6 receives the input signal VIN in response to the first control signal GCS, from the input terminal. The sixth TFT M6 delivers the input signal VIN to the output terminal in response to the reference signal VREF applied to the gate terminal.

The input signal VIN has a first voltage level L1 according to a low state Low and a second voltage level L2 according to a high state High. The input signal VIN may be a clock signal or a clock signal generated in response to the first control signal GCS of FIG. 1. The first voltage level L1 is selected according to a low state Low and the second voltage level L2 is selected according to a high state High. When the second voltage level L2 is selected from the input signal VIN in response to the first control signal GCS, an output voltage starts to rise. On the contrary, when the first voltage level L1 is selected, an output voltage starts to be discharged.

The first voltage level L1 is less than the level of the reference signal VREF. The level of the reference signal VREF is less than the second voltage level L2, and the second voltage level L2 is less than the level of the power voltage VDD. The first node Q and the second node B may be 0 V in an initial state.

Figure 3:
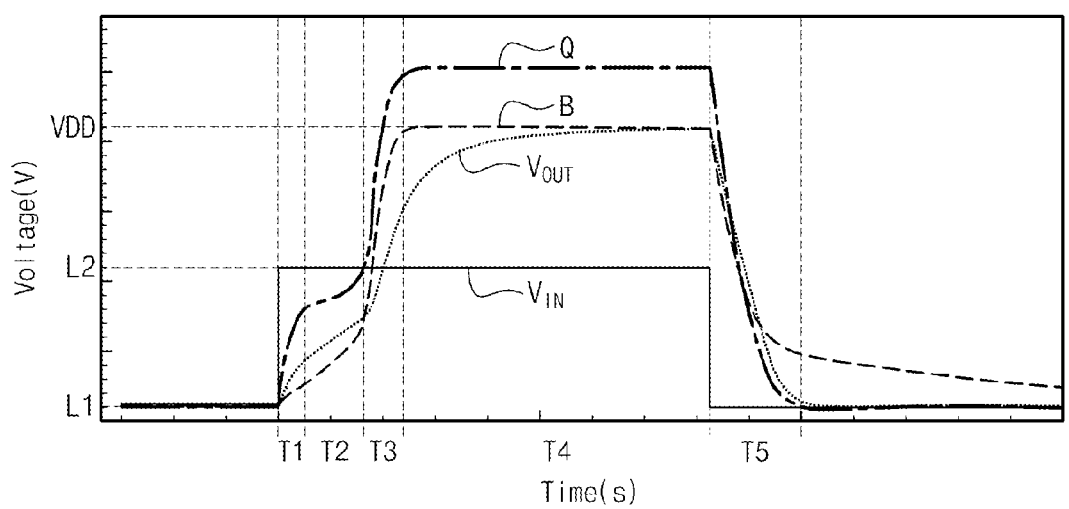
FIG. 3 is a timing diagram illustrating an operation process of the single input level shifter of FIG. 2.

FIG. 3 is a timing diagram illustrating an operation process of the single input level shifter of FIG. 2. Referring to FIGS. 2 and 3, the single input level shifter 110 has the sections of first to fifth stages.

The first stage T1 is a section for increasing an output voltage VOUT. In the first stage T1, the input signal VIN changes from the first voltage level L1 in the low state Low into the second voltage level L2 in the high state High in response to the first control signal GCS. Accordingly, the second voltage level L2 is applied to the gate terminal of the first TFT M1. A voltage level of the first node 13 rises to the second voltage level L2. Additionally, when an initial voltage state of the first node Q is 0 V, voltage is not applied to the gate terminals of the third and fifth TFTs M3 and M5.

The reference signal VREF is applied to each of the gate terminals of the second, fourth, and sixth TFTs M2, M4, and M6. The second voltage level L2 is applied to each of the drain terminals of the second, fourth, and sixth TFTs M2, M4, and M6. Since a source terminal voltage of the second TFT M2 is a voltage of the first node Q, that is, the second voltage level L2, the second TFT M2 is turned off.

An initial voltage state of the second node (B) is 0 V. Accordingly, the fourth TFT M4 applies an input signal to the second node B as the reference signal VREF is applied to the gate terminal.

As mentioned above, the first node Q is raised to a target level of the second voltage level L2, and the second node B is raised to a target level of the reference signal VREF. Since the second voltage level L2 is greater than the reference signal VREF, a voltage of the first node Q is raised faster than a voltage of the second node B. The level of the reference signal VREF is applied to the output voltage VOUT through the sixth TFT M6.

Additionally, since a voltage level of the first node Q is raised faster than a voltage level of the second node B, a coupling phenomenon is generated due to the first capacitor C. Accordingly, due to the coupling phenomenon by the first capacitor C, a voltage level of the second node B may become identical to that of the first node Q. For this reason, the voltage rise of the first node Q by bootstrapping may not occur.

In order to prevent the voltage of the second node B from being raised due to a coupling effect, the capacitances of other capacitors connected to the second node B may be increased. For example, the fourth TFT M4 may be manufactured larger than other TFTs. Due to the area of the fourth TFT M4, the voltage rise of the second node B may be suppressed.

In the second stage T2, a voltage difference between the gate and the source of the first TFT M1 and a voltage difference between the gate and the source of the fourth TFT M4 are reduced. The reason is that the voltage of the first node Q is raised faster than the voltage of the second node B. If a voltage difference is reduced below a reference value, the voltages of the first node Q and the second node B are raised at a similar speed.

Additionally, in the last section of the second stage T2, the voltage level of the first node Q is a value obtained by subtracting the first threshold voltage VT1 of the first TFT M1 from the second voltage level L2. The reason is that the level of the power voltage VDD is greater than the second voltage level L2. The voltage level of the second node B is a value obtained by subtracting the fourth threshold voltage VT4 of the fourth TFT M4 from the reference signal VREF. The reason is that the second voltage level L2 is greater than the level of the reference signal VREF.

In the third state T3, the voltage level of the first node Q is raised through a bootstrapping effect. Accordingly, the level of the output voltage VOUT is raised to the level of the power voltage VDD. For example, it is assumed that the second voltage level L2 is 10 V and the reference signal VREF is 5 V. In the initial state of the third stage T3, the voltage level of the first node Q is a value obtained by subtracting the first threshold voltage VT1 from 10 V. The voltage level of the second node B is a value obtained by subtracting the fourth threshold voltage VT4 from 5V. A voltage difference between the gate and the source of the third TFT M3 becomes 5 V, so that it is greater than the third threshold voltage VT3 of the third TFT M3 after comparison.

The third TFT M3 is turned on to raise the voltage level of the second node B to the level of the power voltage VDD. As the voltage of the second node B is increased, the voltage of the first node Q is further increased through a coupling phenomenon by the first capacitor C. For example, the voltage of the first node Q is further raised than the level of the power voltage VDD. The first node Q is in a floating state because the first and second TFTs M1 and M2 are turned off.

As mentioned above, as a voltage applied to the second node B is raised to the power voltage VDD, the voltage level of the first node Q is further raised than the power voltage VDD. Accordingly, since the voltage level of the first node Q applied to the gate terminal of the fifth TFT M5 is greater than the power voltage VDD, the level of the power voltage VDD is outputted through the fifth TFT M5. Additionally, during a section where the output voltage VOUT is raised to the power voltage VDD, the first, second, fourth, and sixth TFTs M1, M2, M4, and M6 are turned off, so that power consumption may be reduced.

Additionally, when the first TFT M1 is turned off, a voltage difference between the source and the source has a negative value less than a threshold voltage. Likewise, when the second TFT M2 is turned off, a voltage difference between the gate and the source has a negative value less than a threshold voltage. Accordingly, the single input level shift 110 operates normally in a depletion characteristic that each threshold voltage of the first and second TFTs M1 and M2 is a negative value.

The fourth stage T4 is a section in which the output voltage VOUT is raised to the power voltage VDD through the fifth TFT M5. At this point, the voltage levels of the first node Q and the second node B are not raised, and are maintained with a uniformed value.

In the fifth stage T5, the output voltage VOUT starts to drop. The input signal VIN changes from the second voltage level L2 into the first voltage level L1 in response to the first control signal GCS. The first voltage level L1 is less than the threshold voltage VT.

As the voltage level L1 is selected, the source terminals of the second, fourth, and sixth TFTs M2, M4, and M6 are connected to the input terminals, respectively. The drain terminal of the second TFT M2 is connected to the first node Q, and its source terminal is connected to the input terminal. The drain terminal of the fourth TFT M4 is connected to the second node B, and its source terminal is connected to the input terminal. The drain terminal of the sixth TFT M6 is connected to the output terminal, and its source terminal is connected to the input terminal.

The voltage of the first node Q is lowered to 0 V through the second TFT M2. Likewise, the voltage of the second node B is lowered to 0 V through the fourth TFT M4. The output voltage VOUT is lowered to 0 V through the sixth TFT M6. Additionally, in the fifth stage T5, the first, third, and fifth TFTs M1, M3, and M5 are turned off, so that power consumption is reduced.

As mentioned above, in relation to the single input level shifter 110, the output voltage VOUT is raised to the power voltage VDD through a bootstrapping effect. Additionally, the single input level shifter 110 operates normally in a depletion characteristic that the threshold voltage VT is a negative value.

Figure 4:
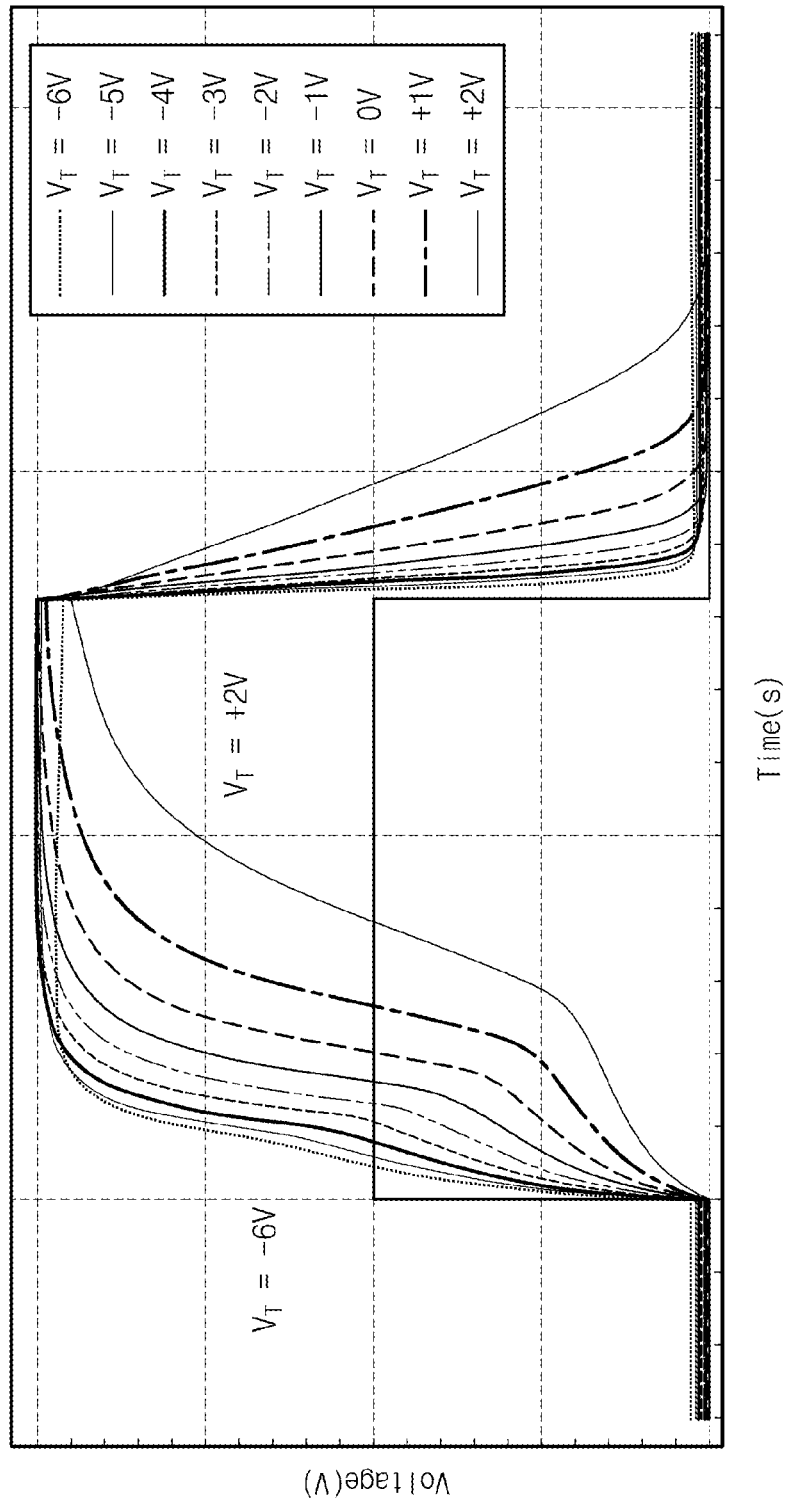
FIG. 4 is a view illustrating a simulation result of a single input level shifter according to the sizes of various threshold voltages.

FIG. 4 is a view illustrating a simulation result of a single input level shifter according to the sizes of various threshold voltages. Referring to FIG. 4, results of the single input shifter 110 according to a change in the threshold voltages of −6V to +2V are shown in the graph. As shown in the graph, the single input level shifter 110 operates normally in a depletion characteristic that a threshold voltage is a negative value.

Figure 5:
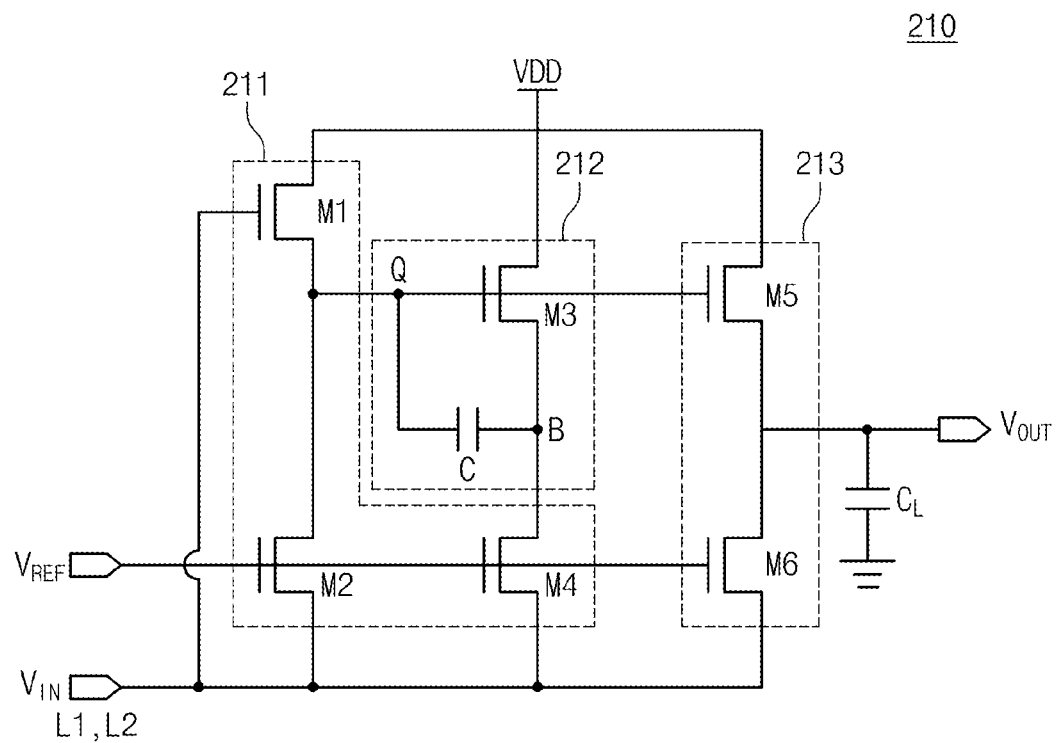
FIG. 5 is a block diagram of a single input level shifter according to an embodiment of the present invention.

FIG. 5 is a block diagram of a single input level shifter according to an embodiment of the present invention. Referring to FIG. 5, the single input level shifter 210 includes an input unit 211, a bootstrapping unit 212, and an output unit 213. The single input level shifter 210 has the same configuration as the single input level shifter 110 of FIG. 2.

The input unit 211 applies the power voltage VDD to the first node Q as the input signal VIN changes from the first voltage level to the second voltage level. The input unit 211 applies the input signal VIN of the second voltage level to the second node B in response to the reference signal VREF applied from the reference terminal.

The bootstrapping unit 212 applies the power voltage VDD to the second node B according to the voltage level of the first node Q. The first capacitor C is provided between the first node Q and the second node B. As the voltage of the second node B is increased due to the power voltage VDD, the voltage of the first node Q is further increased through a coupling phenomenon by the first capacitor C.

The output unit 213 applies the input signal VIN to the output terminal in response to the reference signal VREF. The output unit 213 outputs the power voltage VDD to the output terminal according to the voltage level of the first node Q. The output unit 213 raises the output voltage VOUT to the power voltage VDD through bootstrapping. Additionally, the output unit 213 discharges the voltage of the output terminal when the input signal VIN is shifted from the second voltage level to the first voltage level.

According to an embodiment of the present invention, a single input level shifter includes a plurality of NMOS oxide TFTs and uses only a single input signal. Accordingly, since manufacturing processes become simplified, a driving area may be smaller and manufacturing costs may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A single input level shifter comprising:
an input unit applying a power voltage to a first node in response to an input signal and applying the input signal to a second node in response to a reference signal;
a bootstrapping unit applying the power voltage to the second node according to a voltage level of the first node; and
an output unit applying the input signal to an output terminal in response to the reference signal and applying the power voltage to the output terminal according to the voltage level of the first node,
wherein the bootstrapping unit comprises a capacitor between the first and second nodes, and when the input signal is shifted from a first voltage level to a second voltage level, the bootstrapping unit raises the voltage level of the first node to a level higher than the power voltage; and
wherein the first voltage level is lower than the second voltage level, and the second voltage level is higher than the reference signal and lower than the power voltage.

2. The single input level shifter of claim 1, wherein as the input signal is shifted from the second voltage level to the first voltage level, the output unit discharges a voltage of the output terminal.

3. A single input level shifter comprising:
a first NMOS transistor connected between a first node and a power terminal and controlled in response to an input signal applied from an input terminal;
a second NMOS transistor connected between the first NMOS transistor and the input terminal and controlled in response to a difference between a reference signal applied from a reference terminal and the input signal;
a third NMOS transistor connected between the power terminal and a second node and controlled in response to a voltage applied to the first node;
a fourth NMOS transistor connected between the second node and the input terminal and controlled in response to the difference between the reference signal and the input signal;
a fifth NMOS transistor connected between the power terminal and an output terminal and supplying a power voltage to the output terminal according to a voltage applied to the first node;
a sixth NMOS transistor connected between the output terminal and the input terminal and supplying the input signal to the output terminal in response to the difference between the reference signal and the input signal; and
a capacitor connected between the first and second nodes;
wherein the input signal is shifted between a first voltage level and a second voltage level; and
wherein the first voltage level is lower than the second voltage level, and the second voltage level is higher than the reference signal and lower than the power voltage.

4. The single input level shifter of claim 3, wherein the first to sixth NMOS transistors are oxide thin film transistors.

5. The single input level shifter of claim 3, wherein the fourth NMOS transistor is formed larger than the first, second, third, fifth, and sixth NMOS transistors.

* * * * *